(12) United States Patent
Hao et al.

(10) Patent No.: US 10,288,961 B2
(45) Date of Patent: May 14, 2019

(54) ARRAY SUBSTRATE AND DISPLAY APPARATUS

(71) Applicant: BOE TECHNOLOGY GROUP CO., LTD., Beijing (CN)

(72) Inventors: Xueguang Hao, Beijing (CN); Yongda Ma, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/719,065

(22) Filed: Sep. 28, 2017

(65) Prior Publication Data

US 2018/0088421 A1   Mar. 29, 2018

(30) Foreign Application Priority Data

Sep. 28, 2016   (CN) .................... 2016 2 1091012 U

(51) Int. Cl.
*H01L 27/02* (2006.01)
*H01L 27/12* (2006.01)
*G02F 1/1362* (2006.01)

(52) U.S. Cl.
CPC .. *G02F 1/136204* (2013.01); *G02F 1/136286* (2013.01); *H01L 27/027* (2013.01); *H01L 27/0292* (2013.01); *H01L 27/1244* (2013.01)

(58) Field of Classification Search
CPC ......... G02F 1/136204; G02F 1/136286; H01L 27/1244; H01L 27/0292; H01L 27/027
See application file for complete search history.

(56) References Cited

U.S. PATENT DOCUMENTS 5,744,837 A * 4/1998 Kamiura ........... G02F 1/136204
257/355

* cited by examiner

*Primary Examiner* — Julia Slutsker
(74) *Attorney, Agent, or Firm* — Nath, Goldberg & Meyer; Joshua B. Goldberg; Daniel Bissing

(57) ABSTRACT

The present disclosure provides an array substrate and a display apparatus. The array substrate comprises at least two groups of signal lines, a common electrode line and at least two common electrode sub-lines, at least one signal line of one group of the at least two groups of signal lines is connected to one common electrode sub-line of the at least two common electrode sub-lines via a first electrostatic discharge circuit, at least one signal line of another group of the at least two groups of signal lines is connected to another common electrode sub-line of the at least two common electrode sub-lines via a second electrostatic discharge circuit, each common electrode sub-line is respectively connected to the common electrode line via a third electrostatic discharge circuit.

20 Claims, 3 Drawing Sheets

ARRAY SUBSTRATE AND DISPLAY APPARATUS

CROSS REFERENCE TO RELATED APPLICATION

The present disclosure claims a priority of a Chinese patent application No. 201621091012.0 filed on Sep. 28, 2016, which will be incorporated herein entirely by reference.

TECHNICAL FIELD

The present disclosure relates to a field of display technology, and particularly, relates to an array substrate and a display apparatus.

BACKGROUND

Electro static discharge (ESD) is a common undesirable phenomenon in a semiconductor device. In a thin film transistor (TFT), the electro static discharge may lead to dielectric breakdown, a threshold voltage shift of the thin film transistor or a short circuit between a gate and a source and drain of the thin film transistor. For a thin film transistor liquid crystal display (TFT-LCD), during operations of the thin film transistor liquid crystal display, when static charges on a data line or a gate line accumulate to a certain extent, breakdown of an insulation layer for separating the gate and the source and drain of the thin film transistor may occur, resulting in the short circuit between the source and the gate of the thin film transistor, and moreover, even no breakdown occurs in the insulation layer for separating the gate and the source and drain of the thin film transistor, the accumulated static charges may lead to a voltage difference between the gate and the source of the thin film transistor, resulting in the threshold voltage shift of the thin film transistor and changes of performance characteristics of the thin film transistor.

In order to reduce influences of the electro static discharge on the thin film transistor liquid crystal display, an electrostatic discharge circuit is usually used to release a high voltage static electricity produced during a manufacturing process or a working process of the thin film transistor liquid crystal display. However, in prior art, when the electrostatic discharge circuit is turned off, a leakage current is easily generated so that a quality of a picture displayed by the thin film transistor liquid crystal display is affected.

Since the thin film transistor, the data line, the gate line etc. of the thin film transistor liquid crystal display are generally provided in an array substrate of the thin film transistor liquid crystal display, a problem to be solved urgently is to design an array substrate capable of releasing static electricity well.

SUMMARY

An embodiment of the present disclosure provides an array substrate comprising at least two groups of signal lines, a common electrode line and at least two common electrode sub-lines, at least one signal line of one group of the at least two groups of signal lines is connected to one common electrode sub-line of the at least two common electrode sub-lines via a first electrostatic discharge circuit, at least one signal line of another group of the at least two groups of signal lines is connected to another common electrode sub-line of the at least two common electrode sub-lines via a second electrostatic discharge circuit, each common electrode sub-line is respectively connected to the common electrode line via a third electrostatic discharge circuit.

Optionally, signal lines from a same group of the at least two groups of signal lines are connected to a same common electrode sub-line, and signal lines from different groups of the at least two groups of signal lines are connected to different common electrode sub-lines.

Optionally, at least one group of the at least two groups of signal lines is divided into a plurality of sub-groups, signal lines from a same sub-group are connected to a same common electrode sub-line, and signal lines from different sub-groups are connected to different common electrode sub-lines.

Optionally, the one group of the at least two groups of signal lines includes a plurality of signal lines arranged adjacent to each other, and the another group of the at least two groups of signal lines includes a plurality of signal lines arranged adjacent to each other, each signal line in the one group of the at least two groups of signal lines is connected to the one common electrode sub-line of the at least two common electrode sub-lines, and each signal line in the another group of the at least two groups of signal lines is connected to the another common electrode sub-line of the at least two common electrode sub-lines, the one common electrode sub-line of the at least two common electrode sub-lines and the another common electrode sub-line of the at least two common electrode sub-lines are arranged in a same line.

Optionally, the number of first electrostatic discharge circuits, that the one common electrode sub-line of the at least two common electrode sub-lines is connected to, is the same as that of second electrostatic discharge circuits, that the another common electrode sub-line of the at least two common electrode sub-lines is connected to.

Optionally, each signal line of the at least two groups of signal lines is a data line or a gate line.

Optionally, at least one group of the at least two groups of signal lines includes a plurality of signal lines, each of which is connected to one of the at least two common electrode sub-lines via the first electrostatic discharge circuit or the second electrostatic discharge circuit.

Optionally, each of the first electrostatic discharge circuit, the second electrostatic discharge circuit and the third electrostatic discharge circuit includes at least two discharge paths having discharge directions contrary to each other.

Optionally, each of the first electrostatic discharge circuit, the second electrostatic discharge circuit and the third electrostatic discharge circuit includes at least one electrostatic discharge device of a bidirectional type.

Optionally, each of the first electrostatic discharge circuit, the second electrostatic discharge circuit and the third electrostatic discharge circuit includes at least two electrostatic discharge devices having discharge directions contrary to each other, which are connected in parallel.

An embodiment of the present disclosure further provides a display apparatus comprising the array substrate described above.

DESCRIPTION OF EMBODIMENTS

In order to make a person skilled in the art understand technical solutions of the present disclosure better, the array substrate and the display apparatus provided by the present disclosure will be further described in detail below in conjunction with accompanying drawings and embodiments.

Figure 1:
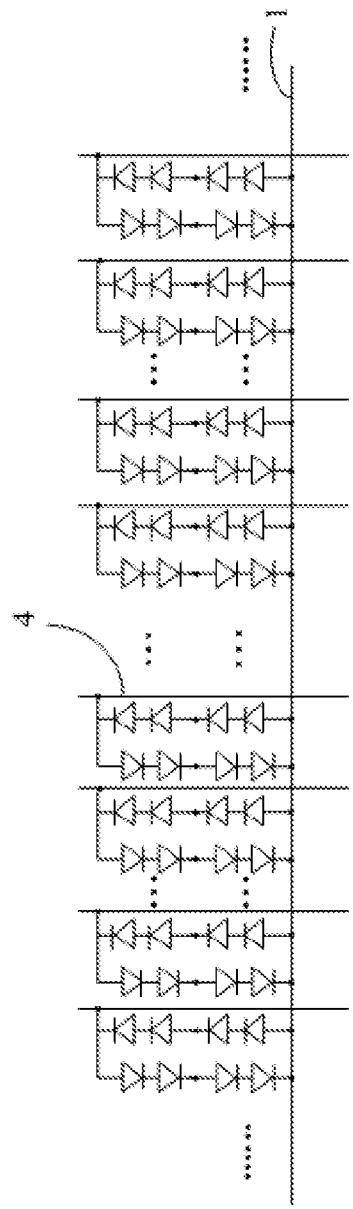
FIG. 1 shows a partial structural diagram of an array substrate.

FIG. 1 shows a partial structural diagram of an array substrate. As shown in FIG. 1, the array substrate comprises a common electrode line 1 and a plurality of data lines 4, there is provided an electrostatic discharge circuit between each data line 4 and the common electrode line 1, each electrostatic discharge circuit, for example, is formed of a plurality of thin film transistors, a gate and a source of each thin film transistor are connected or the gate and a drain of each thin film transistor are connected so that each thin film transistor is equivalent to a diode as shown in FIG. 1.

It should be noted that, a person skilled in the art can determine types and the number of devices included in each electrostatic discharge circuit as required, as long as corresponding functions can be achieved.

As shown in FIG. 1, each electrostatic discharge circuit can include at least two discharge paths, that is, one discharge path from the data line 4 to the common electrode line 1 and the other discharge path from the common electrode line 1 to the data line 4. Each electrostatic discharge circuit, for example, includes at least one electrostatic discharge device of a bidirectional type, or includes at least two electrostatic discharge devices having discharge directions contrary to each other, which are connected in parallel.

Generally, the data lines 4 are provided in a display area of the array substrate, and the common electrode line 1 is provided in a peripheral area of the array substrate. Thus, the electrostatic discharge circuit as shown in FIG. 1 can maintain a charge balance between inside and outside of the array substrate, that is, the array substrate as shown in FIG. 1 maintains the charge balance by including discharge paths having discharge directions contrary to each other.

However, in the mode as shown in FIG. 1, when the electrostatic discharge circuit is turned off, a leakage current may still occur so that the quality of the picture displayed by the thin film transistor liquid crystal display is affected. For example, there may be following cases: (1) the leakage current flows into the data line, the voltage of the data line fluctuates so that the quality of the picture displayed by the thin film transistor liquid crystal display is affected; (2) the leakage current flows into the common electrode line and further flows into a common electrode, the voltage of the common electrode fluctuates so that flicker, cross-talk, greenish etc. may occur in the picture displayed by the thin film transistor liquid crystal display.

First Embodiment

Figure 2:
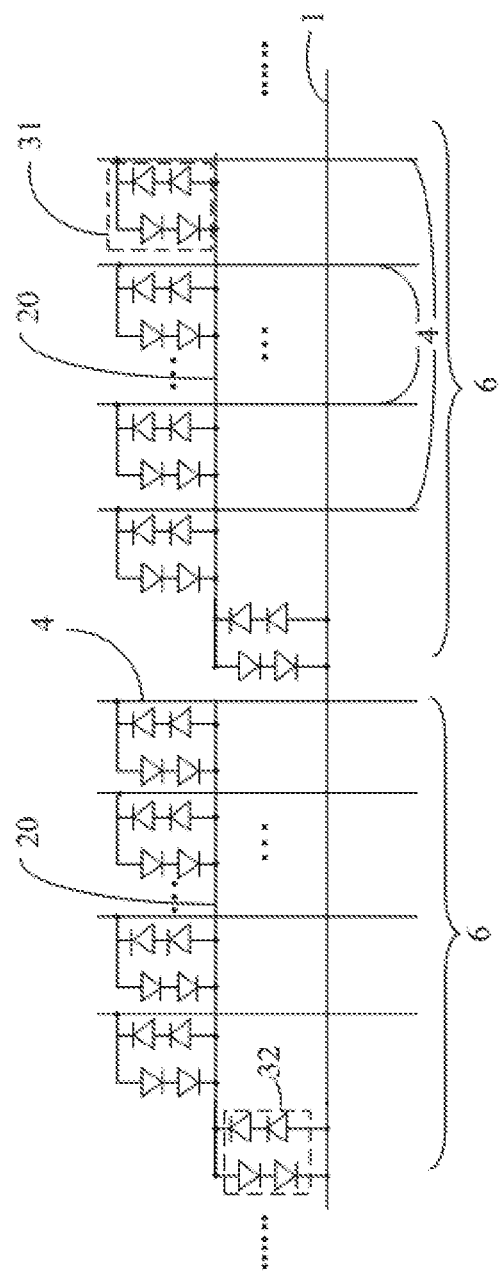
FIG. 2 shows a partial structural diagram of an improved array substrate in a first embodiment of the present disclosure.

The present embodiment provides an improved array substrate. As shown in FIG. 2, the array substrate comprises a common electrode line 1, multiple groups of data lines 4 and a plurality of common electrode sub-lines 20 connected to the common electrode line 1. Each group of data lines 4 includes a plurality of data lines. Data lines 4 from a same group are connected to a same common electrode sub-line 20 via a first or second electrostatic discharge circuit 31, and data lines 4 from different groups are connected to different common electrode sub-lines 20. Each common electrode sub-line 20 is respectively connected to the common electrode line 1 via a third electrostatic discharge circuit 32, and for example, the common electrode sub-lines 20 are arranged in parallel to the common electrode line 1.

Optionally, as shown in FIG. 2, each group of data lines 4 are arranged adjacent to each other, and the plurality of common electrode sub-lines 20 are arranged in a same line.

In the present embodiment, by providing the plurality of common electrode sub-lines 20 separated from each other, connecting the data lines 4 to the common electrode sub-lines 20 via the first or second electrostatic discharge circuit 31 respectively, and respectively connecting each common electrode sub-line 20 to the common electrode line 1 via the third electrostatic discharge circuit 32, the leakage current is dispersed so that there is no relatively large leakage current flowing into the data line 4 or the common electrode line 1, thereby a fluctuation of the voltage of the data line 4 or the common electrode line 1 is avoided.

In the present embodiment, each data line 4 is connected to a data driver chip, and for example, each data line 4 is arranged perpendicular to the common electrode sub-lines 20, and the common electrode sub-lines 20 are arranged in parallel to the common electrode line 1. Data lines 4 within a fan-out area of each data driver chip may belong to a same group, and are connected to a same common electrode sub-line 20. Data lines 4 within fan-out areas of different data driver chips may belong to different groups, and are connected to different common electrode sub-lines 20. For example, as shown in FIG. 2, data lines 4 within each area 6 are connected to a same common electrode sub-line 20, and data lines 4 within different areas 6 are connected to different common electrode sub-lines 20.

Specifically, as shown in FIG. 2, each common electrode sub-line 20 may be connected to multiple data lines 4 via multiple first or second electrostatic discharge circuits 31, and each first or second electrostatic discharge circuit 31 includes at least two discharge paths, that is, one discharge path from the data line 4 to the common electrode sub-line 20, and the other discharge path from the common electrode sub-line 20 to the data line 4. Each first or second electrostatic discharge circuit 31 may include at least one electrostatic discharge device of a bidirectional type, or at least two electrostatic discharge devices having discharge directions contrary to each other, which are connected in parallel. Since the first or second electrostatic discharge circuit 31 includes discharge paths having discharge directions contrary to each other, static electricity on the data line 4 and the common electrode sub-line 20 can be dispersed effectively.

Optionally, each data line 4 is respectively connected to one common electrode sub-line 20 via the first or second electrostatic discharge circuit 31, so that each data line 4 can be protected effectively.

Optionally, the number of first or second electrostatic discharge circuits, that one common electrode sub-line of the plurality of common electrode sub-lines 20 is connected to, is the same as that of first or second electrostatic discharge circuits, that another common electrode sub-line of the plurality of common electrode sub-lines 20 is connected to, that is, each common electrode sub-line 20 is respectively connected to a same number of first or second electrostatic discharge circuits 31, and by defining the number of the first or second electrostatic discharge circuits 31 connected to each common electrode sub-line 20, load balancing of the common electrode sub-lines 20 can be maintained.

In the present embodiment, each common electrode sub-line 20 is respectively connected to the common electrode line 1 via at least one third electrostatic discharge circuit 32, and each third electrostatic discharge circuit 32 includes at least two discharge paths, that is, one discharge path from the common electrode sub-line 20 to the common electrode line 1, and the other discharge path from the common electrode line 1 to the common electrode sub-line 20. Each third electrostatic discharge circuit 32 may include at least one electrostatic discharge device of a bidirectional type, or at least two electrostatic discharge devices having discharge directions contrary to each other, which are connected in parallel. Since the third electrostatic discharge circuit 32 includes discharge paths having discharge directions contrary to each other, static electricity on the common electrode sub-line 20 and the common electrode line 1 can be dispersed effectively.

Although only two common electrode sub-lines 20 are illustrated in the present embodiment, the present disclosure is not limited thereto, and a person skilled in the art can determine the number of common electrode sub-lines 20 as required.

In addition, although an example in which data lines 4 within each area 6 (i.e., each group) are connected to a same common electrode sub-line 20 is described in the present embodiment, the present disclosure is not limited thereto. For example, a person skilled in the art can divide data lines 4 within each area 6 (i.e., each group) into a plurality of sub-groups, data lines 4 in each sub-group are connected to a same common electrode sub-line 20, and data lines 4 in different sub-groups of each area 6 are connected to different common electrode sub-lines 20.

Second Embodiment

Figure 3:
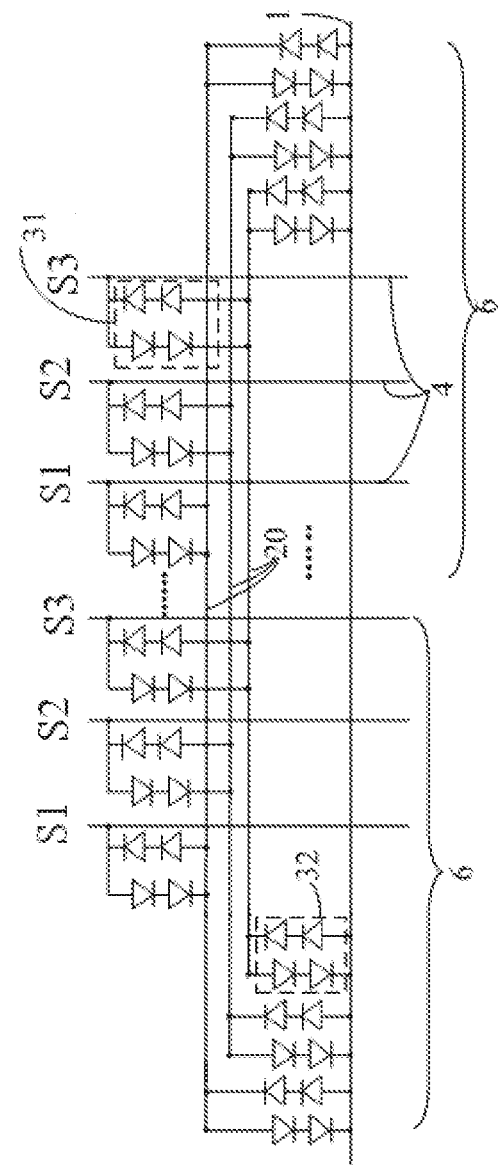
FIG. 3 shows a partial structural diagram of an improved array substrate in a second embodiment of the present disclosure.

The present embodiment provides an array substrate which is different from that in the first embodiment in that, as shown in FIG. 3, in the present embodiment, data lines 4 within each area 6 (i.e., each group) may be connected to different common electrode sub-lines 20, and data lines 4 of different areas 6 (i.e., different groups) may be connected to a same common electrode sub-line 20.

For example, different data lines 4 within each area 6 may be connected to different common electrode sub-lines 20 respectively, corresponding data lines 4 (e.g., data lines 4 at corresponding positions) in different areas 6 may be connected to a same common electrode sub-line 20. As shown in FIG. 3, data lines 4 numbered S1, S2 and S3 in each area 6 are respectively connected to different common electrode sub-lines, data lines 4 numbered S1 in different areas 6 are connected to a same common electrode sub-line 20, data lines 4 numbered S2 in different areas 6 are connected to a same common electrode sub-line 20, and data lines 4 numbered S3 in different areas 6 are connected to a same common electrode sub-line 20.

Other structures of the array substrate of the present embodiment are the same as those in the first embodiment, and will not be described in detail herein.

In the present embodiment, by providing the plurality of common electrode sub-lines 20 separated from each other, the leakage current is dispersed so that there is no relatively large leakage current flowing into the data line 4 or the common electrode line 1, thereby a fluctuation of the voltage of the data line 4 or the common electrode line 1 is avoided.

Although only three common electrode sub-lines 20 are illustrated in the present embodiment, the present disclosure is not limited thereto, and a person skilled in the art can determine the number of common electrode sub-lines 20 as required.

In addition, although an example in which different data lines 4 within each area 6 (i.e., each group) are respectively connected to different common electrode sub-lines 20, and corresponding data lines 4 in different areas 6 (i.e., different groups) are connected to a same common electrode sub-line 20 is described in the present embodiment, the present disclosure is not limited thereto. For example, a person skilled in the art can divide data lines 4 within each area 6 (i.e., each group) into a plurality of sub-groups, data lines 4 in different sub-groups of each area 6 are connected to different common electrode sub-lines 20 respectively, and data lines 4 of sub-groups numbered the same in different areas 6 (i.e., different groups) are connected to a same common electrode sub-line 20.

Third Embodiment

The present embodiment provides an array substrate which is different from those in the first and second embodiments in that, in the present embodiment, the electrostatic discharge circuits and the common electrode sub-lines are provided between gate lines and the common electrode line, and in this case, gate lines are connected to the common electrode sub-lines via first or second electrostatic discharge circuits, and each common electrode sub-line is respectively connected to the common electrode line via the third electrostatic discharge circuit. For example, the common electrode sub-lines are arranged perpendicular to the common electrode line.

In the present embodiment, by providing the plurality of common electrode sub-lines separated from each other, connecting the gate lines to the common electrode sub-lines via first or second electrostatic discharge circuits respectively, and respectively connecting each common electrode sub-line to the common electrode line via the third electrostatic discharge circuit, the leakage current is dispersed so that there is no relatively large leakage current flowing into the gate line or the common electrode line, thereby a fluctuation of the voltage of the gate line or the common electrode line is avoided.

In the present embodiment, each gate line is connected to a gate driver chip, and for example, the gate lines are arranged perpendicular to the common electrode sub-lines, and the common electrode sub-lines are arranged perpendicular to the common electrode line, that is, the gate lines are arranged in parallel to the common electrode line.

It should be understood that, a person skilled in the art can determine, as required, the number of common electrode sub-lines, and corresponding connection relationships between the gate lines and the common electrode sub-lines. For example, gate lines within a fan-out area of each gate driver chip (i.e., each area or each group) may be connected to a same common electrode sub-line, and gate lines within fan-out areas of different gate driver chips (i.e., different areas or different groups) may be connected to different common electrode sub-lines, or, gate lines in each area (i.e., each group) may be connected to different common electrode sub-lines, and gate lines in different areas (i.e., different groups) may be connected to a same common electrode sub-line.

Other structures of the array substrate of the present embodiment are the same as or similar to those in the first or second embodiment, and will not be described in detail herein.

Fourth Embodiment

The present embodiment provides a display apparatus comprising the array substrate of the first, second or third embodiment of the present disclosure.

The display apparatus includes any product or member having a display function, such as electronic paper, mobile phone, tablet computer, television, display, notebook computer, digital photo frame, and navigator.

The display apparatus comprises the array substrate capable of releasing static electricity well and maintaining charge balancing, thus can display a picture well.

Although an example in which electrostatic discharge circuits and common electrode sub-lines are provided between data lines or gate lines and the common electrode line is described above, the present disclosure is not limited thereto, and a person skilled in the art can provide the electrostatic discharge circuits and the common electrode sub-lines as required. For example, the electrostatic discharge circuits and the common electrode sub-lines may be provided between other signal lines and the common electrode line.

In addition, terms of "first", "second" and "third" mentioned above are only used for distinguishing, and in a case where there is no need to distinguish, for example, terms of "first electrostatic discharge circuit", "second electrostatic discharge circuit", "third electrostatic discharge circuit" and "electrostatic discharge circuit" refer to the same. Certainly, the "first electrostatic discharge circuit", the "second electrostatic discharge circuit" and the "third electrostatic discharge circuit" may be the same or different from each other, and a person skilled in the art can determine types and the number of devices included in each electrostatic discharge circuit as required, as long as corresponding functions can be achieved.

It should be understood that, the above embodiments are merely exemplary embodiments for explaining principle of the present disclosure, but the present disclosure is not limited thereto. Various modifications and improvements may be made by those ordinary skilled in the art within the spirit and essence of the present disclosure, these modifications and improvements fall into the protection scope of the present disclosure.

The invention claimed is:

1. An array substrate, comprising at least two groups of signal lines, a common electrode line and at least two common electrode sub-lines, at least one signal line of one group of the at least two groups of signal lines is connected to one common electrode sub-line of the at least two common electrode sub-lines via a first electrostatic discharge circuit, at least one signal line of another group of the at least two groups of signal lines is connected to another common electrode sub-line of the at least two common electrode sub-lines via a second electrostatic discharge circuit, each common electrode sub-line is respectively connected to the common electrode line via a third electrostatic discharge circuit.

2. The array substrate of claim 1, wherein signal lines from a same group of the at least two groups of signal lines are connected to a same common electrode sub-line, and signal lines from different groups of the at least two groups of signal lines are connected to different common electrode sub-lines.

3. The array substrate of claim 1, wherein at least one group of the at least two groups of signal lines is divided into a plurality of sub-groups, signal lines from a same sub-group are connected to a same common electrode sub-line, and signal lines from different sub-group are connected to different common electrode sub-lines.

4. The array substrate of claim 1, wherein a number of first electrostatic discharge circuits, that the one common electrode sub-line of the at least two common electrode sub-lines is connected to, is the same as that of second electrostatic discharge circuits, that the another common electrode sub-line of the at least two common electrode sub-lines is connected to.

5. The array substrate of claim 1, wherein each signal line of the at least two groups of signal lines is a data line or a gate line.

6. The array substrate of claim 1, wherein at least one group of the at least two groups of signal lines includes a plurality of signal lines, each of which is connected to one of the at least two common electrode sub-lines via the first or second electrostatic discharge circuit.

7. The array substrate of claim 1, wherein each of the first electrostatic discharge circuit, the second electrostatic discharge circuit and the third electrostatic discharge circuit includes at least two discharge paths having discharge directions contrary to each other.

8. The array substrate of claim 1, wherein each of the first electrostatic discharge circuit, the second electrostatic discharge circuit and the third electrostatic discharge circuit includes at least one electrostatic discharge device of a bidirectional type.

9. The array substrate of claim 1, wherein each of the first electrostatic discharge circuit, the second electrostatic discharge circuit and the third electrostatic discharge circuit includes at least two electrostatic discharge devices having discharge directions contrary to each other, which are connected in parallel.

10. A display apparatus, comprising the array substrate of claim 1.

11. The display apparatus of claim 10, wherein signal lines from a same group of the at least two groups of signal lines are connected to a same common electrode sub-line, and signal lines from different groups of the at least two groups of signal lines are connected to different common electrode sub-lines.

12. The display apparatus of claim 10, wherein at least one group of the at least two groups of signal lines is divided into a plurality of sub-groups, signal lines from a same sub-group are connected to a same common electrode sub-line, and signal lines from different sub-groups are connected to different common electrode sub-lines.

13. The display apparatus of claim 10, wherein a number of first electrostatic discharge circuits, that the one common electrode sub-line of the at least two common electrode sub-lines is connected to, is the same as that of second electrostatic discharge circuits, that the another common electrode sub-line of the at least two common electrode sub-lines is connected to.

14. The display apparatus of claim 10, wherein each signal line of the at least two groups of signal lines is a data line or a gate line.

15. The display apparatus of claim 10, wherein at least one group of the at least two groups of signal lines includes a plurality of signal lines, each of which is connected to one of the at least two common electrode sub-lines via the first or second electrostatic discharge circuit.

16. The display apparatus of claim 10, wherein each of the first electrostatic discharge circuit, the second electrostatic discharge circuit and the third electrostatic discharge circuit includes at least two discharge paths having discharge directions contrary to each other.

17. The display apparatus of claim 10, wherein each of the first electrostatic discharge circuit, the second electrostatic discharge circuit and the third electrostatic discharge circuit includes at least one electrostatic discharge device of a bidirectional type.

18. The display apparatus of claim 10, wherein each of the first electrostatic discharge circuit, the second electrostatic discharge circuit and the third electrostatic discharge circuit includes at least two electrostatic discharge devices having discharge directions contrary to each other, which are connected in parallel.

19. An array substrate, comprising at least two groups of signal lines, a common electrode line and at least two common electrode sub-lines, at least one signal line of one group of the at least two groups of signal lines is connected to one common electrode sub-line of the at least two common electrode sub-lines via a first electrostatic discharge circuit, at least one signal line of another group of the at least two groups of signal lines is connected to another common electrode sub-line of the at least two common electrode sub-lines via a second electrostatic discharge circuit, each common electrode sub-line is respectively connected to the common electrode line via a third electrostatic discharge circuit, wherein the one group of the at least two groups of signal lines includes a plurality of signal lines arranged adjacent to each other, and the another group of the at least two groups of signal lines includes a plurality of signal lines arranged adjacent to each other, each signal line in the one group of the at least two groups of signal lines is connected to the one common electrode sub-line of the at least two common electrode sub-lines, and each signal line in the another group of the at least two groups of signal lines is connected to the another common electrode sub-line of the at least two common electrode sub-lines, the one common electrode sub-line of the at least two common electrode sub-lines and the another common electrode sub-line of the at least two common electrode sub-lines are arranged in a same line.

20. A display apparatus, comprising an array substrate comprising at least two groups of signal lines, a common electrode line and at least two common electrode sub-lines, at least one signal line of one group of the at least two groups of signal lines is connected to one common electrode sub-line of the at least two common electrode sub-lines via a first electrostatic discharge circuit, at least one signal line of another group of the at least two groups of signal lines is connected to another common electrode sub-line of the at least two common electrode sub-lines via a second electrostatic discharge circuit, each common electrode sub-line is respectively connected to the common electrode line via a third electrostatic discharge circuit, wherein the one group of the at least two groups of signal lines includes a plurality of signal lines arranged adjacent to each other, and the another group of the at least two groups of signal lines includes a plurality of signal lines arranged adjacent to each other, each signal line in the one group of the at least two groups of signal lines is connected to the one common electrode sub-line of the at least two common electrode sub-lines, and each signal line in the another group of the at least two groups of signal lines is connected to the another common electrode sub-line of the at least two common electrode sub-lines, the one common electrode sub-line of the at least two common electrode sub-lines and the another common electrode sub-line of the at least two common electrode sub-lines are arranged in a same line.

* * * * *